(12) United States Patent
Singh et al.

(10) Patent No.: US 6,364,089 B1
(45) Date of Patent: Apr. 2, 2002

(54) MULTI-STATION ROTARY DIE HANDLING DEVICE

(75) Inventors: Inderjit Singh, San Jose; Jaime A. Bayan, Palo Alto; Hem Takiar, Fremont; Ashok S. Prabhu, Sunnyvale, all of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/549,241

(22) Filed: Dec. 10, 1999

(51) Int. Cl.[7] .............................................. B65G 47/24
(52) U.S. Cl. ........................ 198/408; 198/406; 198/403
(58) Field of Search ........................ 198/471.1, 377.04, 198/377.06, 377.08, 403, 406, 397.03, 377.1, 378, 408; 414/219, 935, 941

(56) References Cited

U.S. PATENT DOCUMENTS

| | | | | |
|---|---|---|---|---|
| 4,128,174 A | * | 12/1978 | Frisbie et al. ............ | 198/408 X |
| 4,308,942 A | * | 1/1982 | Ackley ..................... | 198/408 X |
| 5,110,255 A | * | 5/1992 | Le Ban et al. ............ | 198/408 X |
| 5,865,292 A | * | 2/1999 | Aguilar et al. ............ | 198/408 X |

FOREIGN PATENT DOCUMENTS

| | | | | |
|---|---|---|---|---|
| FR | 2670191 | * | 6/1992 | ............... 198/471.1 |

* cited by examiner

Primary Examiner—James R. Bidwell
(74) Attorney, Agent, or Firm—Beyer Weaver & Thomas, LLP

(57) ABSTRACT

The invention relates to apparatus and methods for semiconductor device handling. In one aspect, the invention relates to a rotary flipper including a wheel having a plurality of stations. A semiconductor device is placed within a first station in a first orientation. While the semiconductor device is held, the wheel portion of the rotary flipper rotates and the next station receives another semiconductor device. When the first station is in an unloading position, the semiconductor device is released. At this point, the semiconductor device is oriented in a second position. In one aspect, the semiconductor device is released into a cavity of a tape and reel. In another aspect, vacuum pressure is applied to hold the die. In one embodiment, the invention relates to a semiconductor device handling apparatus and apparatus that includes of a rotary semiconductor device flipper.

28 Claims, 4 Drawing Sheets

MULTI-STATION ROTARY DIE HANDLING DEVICE

FIELD OF THE INVENTION

The present invention pertains to apparatus and methods used in handling semiconductor devices and the like.

BACKGROUND OF THE INVENTION

Semiconductor Integrated Circuits (ICs) are typically fabricated in wafer form. After fabrication, the individual chips are scribed from the wafer and then undergo numerous processing and handling steps before they are tested and packaged. A tape and reel assembly is typically used to transport the scribed chips to the individual processing stations. The tape and reel assembly includes a tape with a plurality of cavities spaced at regular intervals. Once a chip has been placed inside a cavity, the cavity is sealed with an adhesive tape so the chip can be safely transported from station to station by the tape and. reel assembly. Special devices, known as device transfer machines, are used to transfer chips scribed from a wafer into the cavities of the tape and reel assembly.

FIG. 1A illustrates a diagrammatic side view of a device transfer machine 100. The device transfer machine 100 is responsible for transferring a semiconductor device, such as a flip chip die 102, from a stretched wafer 104 to a cavity 105. The cavity 105 is included in a tape 106 of a tape and reel 108. The transfer to the cavity 105 is complicated by the small size, delicacy and orientation of the die 102. An exemplary flip chip die may be about 35 mils square, which limits the applicable handling techniques. In addition, after sawing, the die 102 is oriented with its solder bumps 110 facing up, however, the die 102 is to be placed in the cavity 105 with the solder bumps 110 facing down.

The device transfer machine 100 performs the transfer from the stretched wafer 104 to the cavity 105 in five steps. The first step involves attaining the die 102 from the stretched wafer 104. Typically, the die 102 is picked up by a loader arm 112. The loader arm 112 may a robotic arm or another suitable pick and place mechanism. FIG. 1B illustrates a closer diagrammatic view of a head 114 of the loader arm 112. The head 114 includes a vacuum tube 116. To hold the die 102, the vacuum tube 116 applies a vacuum pressure on the surface 118 of the die 102 between the solder bumps 110. In addition, a vision apparatus 130 determines if the right die is being picked up.

To flip the die 102, a flipper 122 is used. The flipper 122 includes two platforms 126 and 128 on either end of a flipper arm 124. In the second step, the loader arm 114 places the die 102 onto the platform 126. In the third step, an actuator 132 rotates the flipper arm 124 to flip the die 102. In the fourth step, a placing mechanism 136 takes the die 102 from the platform 126 on the flipper 122 and moves it to the vicinity of the cavity 105.

In the fifth step, the die 102 is placed within the cavity 105 of the tape 106 by the placing mechanism 136. A second vision apparatus 138 is used to determine the correct position of the die 102 in the cavity 105. The die 102 and cavity 105 may then be indexed. Subsequently, a cover tape 140 is applied over cavity 105 to contain and protect the die 102 during shipping.

The device transfer machine 100 is problematic for a number of reasons. The handling rate of the flipper 122 is typically less than a thousand units per hour. This represents a significant bottleneck in the overall IC testing and packaging sequence. Attempts have been made to increase the rotational speed of the elongated mechanical arm. However, the increased speed creates excessive rotational torque, causing the chip to move or even fall off the platform.

In view of the foregoing, a device transfer machine with improved throughput would be desirable.

SUMMARY OF THE INVENTION

To achieve the foregoing, the invention provides to a rotary flipper including a wheel having a plurality of stations. A semiconductor device is placed within a first station in a first orientation. While the semiconductor device is held, the wheel portion of the rotary flipper rotates and the next station receives another semiconductor device. When the first station reaches an unloading position, the semiconductor device is released. At this point, the semiconductor device is in a second orientation. The wheel also includes an intermittent position between the loading and unloading position in which another semiconductor device may be loaded into another station on the wheel.

In another aspect, to facilitate continuous transfer to a tape and reel, the size of the wheel and the spatial arrangement of the stations on the circumference of the wheel are proportional to the spacing of the cavities on the tape and reel. Advantageously, this permits continuous and synchronous motion between the rotary flipper and the tape and reel. In another aspect, the number of stations on the wheel is maximized to restrict the motion of the wheel to small steps, thus eliminating high torque movements required for high speed movement over a larger distance.

In one aspect, a vacuum pressure is applied within the station to hold the semiconductor device. The vacuum pressure for a station may be independently controlled or automatically upon positioning of the wheel. In one embodiment, the vacuum pressure is not used and a shield is used to contain the semiconductor device in the station during movement.

In another embodiment, the invention relates to a semiconductor device transfer machine including a rotary flipper.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well known processes, procedures, components, and circuits have not been described in detail so as not to unnecessarily obscure aspects of the present invention.

Figure 1A:
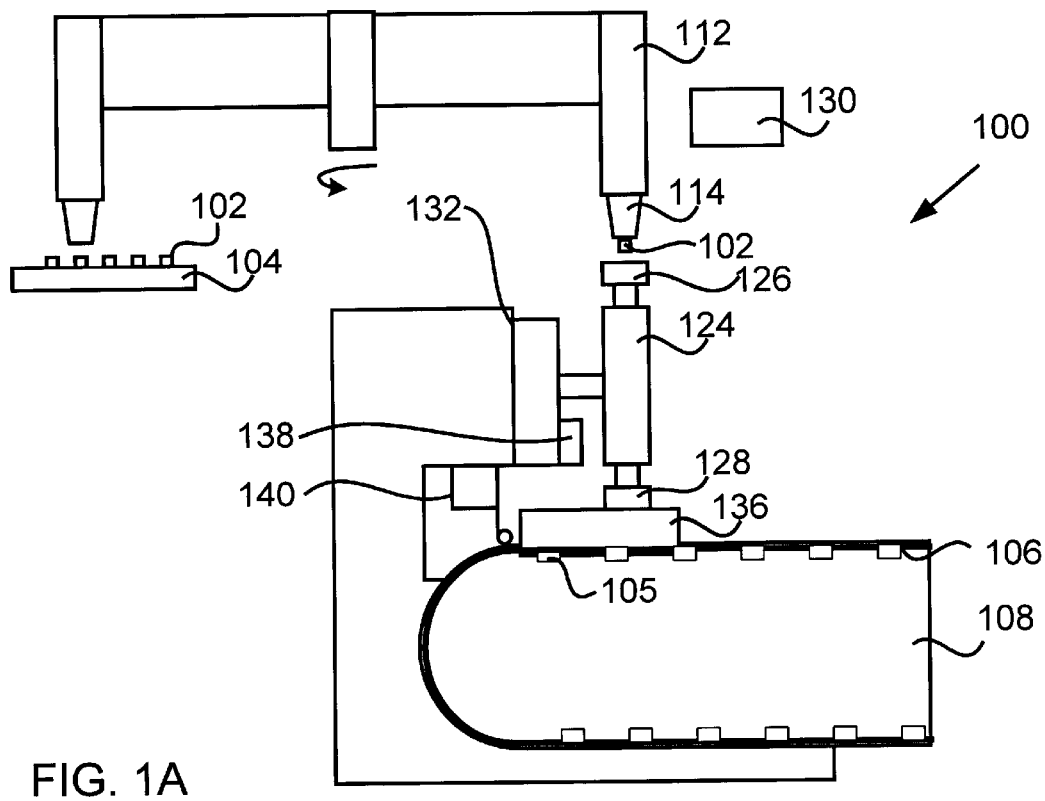
FIG. 1A illustrates a diagrammatic side view of a conventional semiconductor device transfer machine.
Figure 1B:
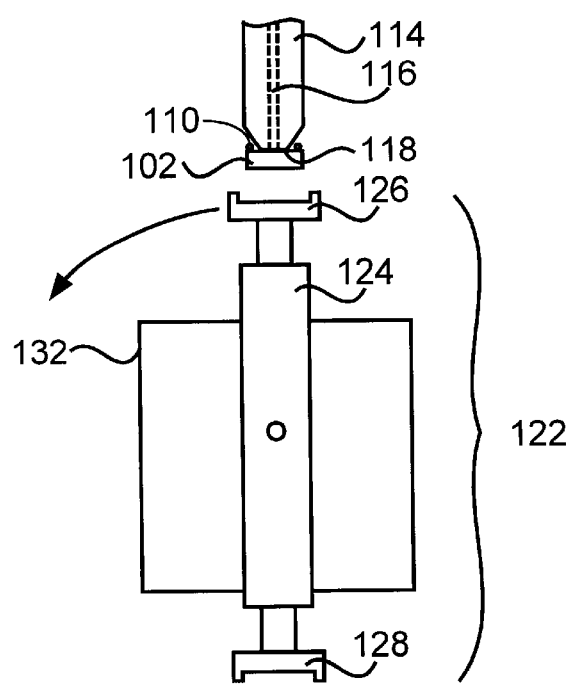
FIG. 1B illustrates a diagrammatic view of the rotary flipper and a head of the loader arm of FIG. 1.
Figure 2:
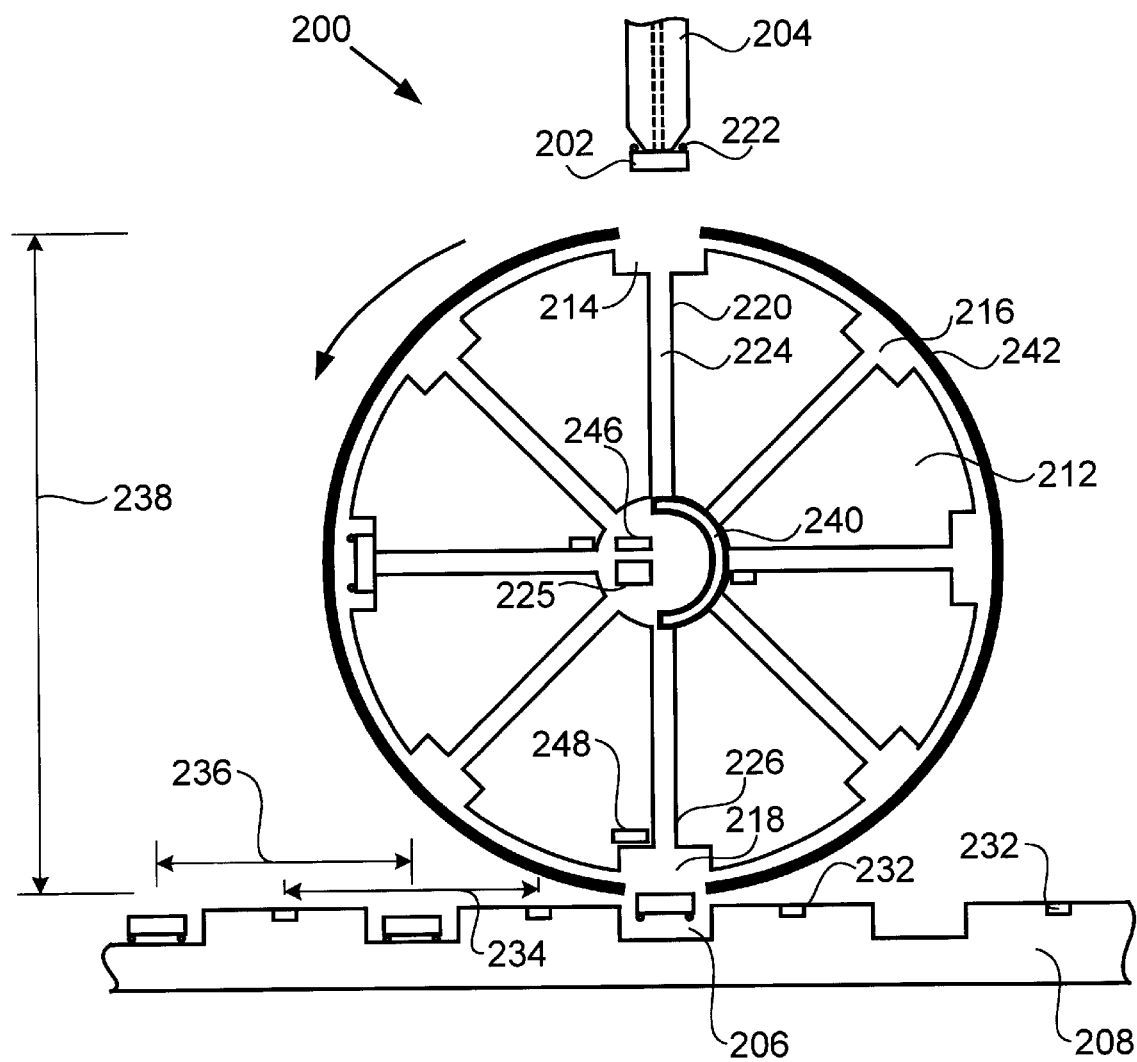
FIG. 2 illustrates a cross section of a rotary flipper in accordance with one embodiment of the present invention.
Figure 3:
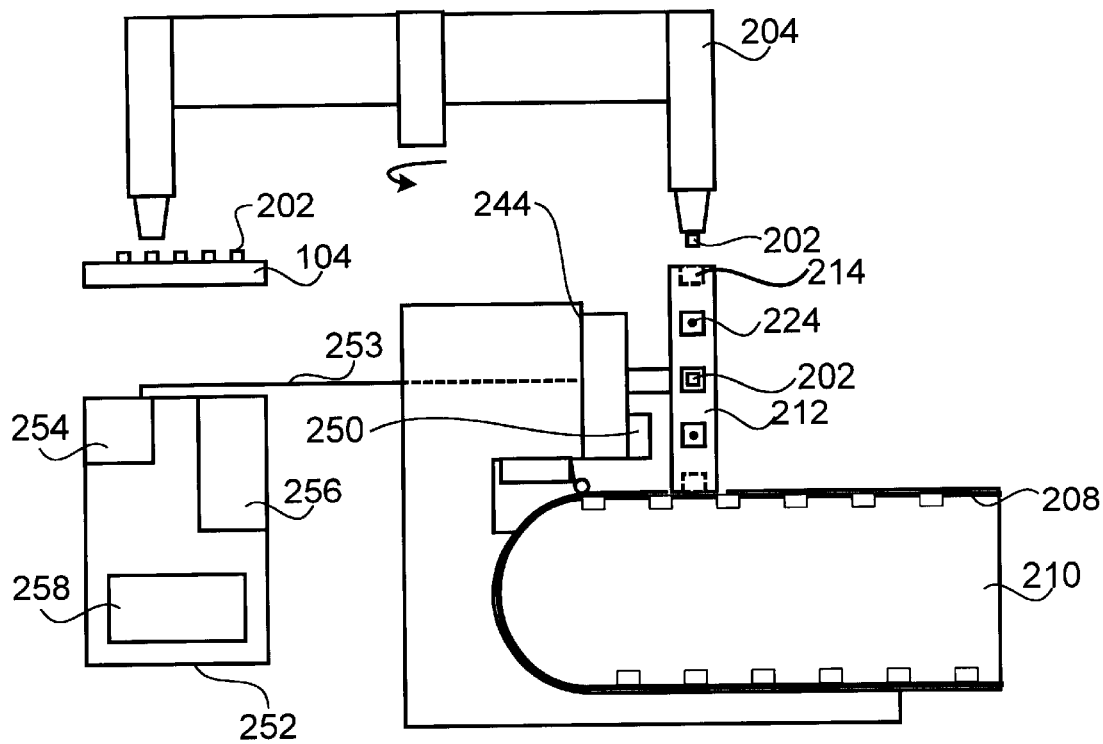
FIG. 3 illustrates a diagrammatic side view of a semiconductor device transfer machine including a rotary flipper in accordance with one embodiment of the present invention.

Referring initially to FIGS. 2–3, a rotary flipper 200 suitable for handling semiconductor devices is shown. For exemplary purposes, the semiconductor devices referred to in the drawings will be chip scale packaged dice 202. The rotary flipper 200 receives a die 202 from a loading arm 204 and places the die 202 in a cavity 206 of a tape 208. The tape 208 is fed continuously as part of a tape and reel 210. The rotary flipper 200 includes a wheel 212. The wheel 212 includes a plurality of stations 214, 216 and 218. The die 202 is placed within the station 214 when it is at the loading position 220. In the loading position 220, the die 202 is then held in a first orientation with its solder bumps 222 facing up. Subsequently, the wheel 212 rotates and the next station 216 receives another die 202 from the loader arm 204.

To hold the die 202 within the station 214, a vacuum pressure is applied. The vacuum pressure is applied to the station 214 through a vacuum tube 224. The vacuum tube 224 is in fluid communication with a vacuum port 225. In one embodiment, application of the vacuum pressure to the vacuum tubes of the rotary flipper 200 is individually controlled for each station. By way of example, the vacuum tubes 224 may include toggles which switch the pressure on/off for each of the cavities 214, 216 and 218.

Subsequently, when the station 214 is in an unloading position 226, the vacuum pressure is cut and the die 202 is released into the cavity 206 of the tape 208. For the rotary flipper 200, the wheel 212 rotates 180 degrees before releasing the die 202 from the station 214 into the cavity 206. Correspondingly, the die 202 is loaded into the cavity 206 in a second orientation with the solder bumps 222 facing down.

The rotary flipper 200 is suitable for use in a semiconductor device handling apparatus 300. For continuous handling within the semiconductor device handling apparatus 300, the tape 208 includes a continuous set of cavities 206 for receiving dies 202 from the rotary flipper 200. After receiving the die 202, a covering tape 230 is subsequently applied to the upper side of the tape 208 to provide an upper constraint for the die 202 within the cavity 206.

Position guides 232 are included in the tape 208 to allow automated positioning of the tape 208. The pitch 234 refers to the distance moved by the tape 208 between successive loadings. The pitch 234 is matched to a cavity pitch 236 between adjacent cavities 206. In a preferred embodiment, the spatial arrangement of the stations on the circumference of the wheel 212 is matched to the cavity pitch 236. Advantageously, this matching permits synchronization between the rotary flipper 200 and the tape and reel 210. The synchronization leads to simplified control, simpler timing and faster transfer of the dies 202. The circumferential arrangement of stations may be adapted by altering the number of stations on the wheel 212. In addition, the wheel diameter 238 may be altered to achieve a desired circumferential arrangement of the stations 214.

It should also be noted that as the wheel diameter 238 is increased, wheel 212 inertia during movement increases, which may compromise handling accuracy. In one embodiment, the number of stations on the wheel 212 is maximized for a particular wheel diameter 238 with respect to the cavity pitch 236. In this manner, the motion of the wheel 212 during die 202 handling is limited to small steps, thus eliminating high torque movements required for high-speed movement over a larger distance.

The wheel diameter 238 may also be adapted to accommodate the semiconductor device handling apparatus 300. In one embodiment, the wheel diameter 238 may be adapted to the distance across the two ends of the existing flipper 122 to minimize hardware adaptations to conventional semiconductor device handling apparatus. Alternatively, the wheel diameter 238 and other dimensions of the rotary flipper 200 may also be sensitive to the geometry of the surrounding components of the semiconductor device handling apparatus and may be adapted accordingly.

Figure 4:
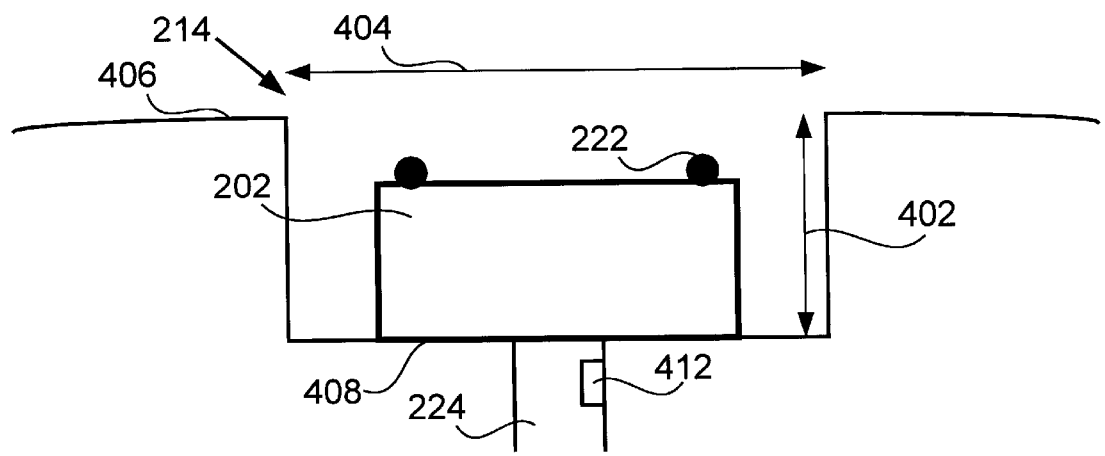
FIG. 4 illustrates a station holding a semiconductor device in accordance with one embodiment of the present invention.

FIG. 4 illustrates the station 214 while holding the die 202. The station 214 may be described by a station height 402 and station width 404. The station height 402 can be varied depending on the dimensions of the die 202 or semiconductor device. By way of example, a station height 402 in the range of approximately 0.4 to 0.8 millimeters is suitable for a 0.6 millimeter die. In another embodiment, the solder bumps 222 sit lower in the station 214 than the outer surface 406. In this case, a station height 404 of about 0.7 to 0.75 millimeters is suitable for the 0.8 millimeter die. Similarly, the station width 404 may designed with respect to the die 202. By way of example, a station width 404 in the range of approximately 1.125 to 1.175 millimeters is suitable for a 1 millimeter square die.

To hold the die 202, the vacuum pressure is applied to the back side 408 of the die 202, thus holding the die 202 to the surface 410 of the station 214. In other words, the vacuum pressure holds the die 202 whose back side 408 at least partially seals the vacuum tube 224. The vacuum is generated by an external vacuum source and extends to the station 214 by the vacuum tube 224 and the vacuum port 225. Preferably, the pressure in the vacuum tube 224 is sufficient to apply enough force to hold the die 202 until it is released at the unloading position 226. Typically, this required vacuum pressure will vary depending on, for example, the semiconductor device handling apparatus 300, the die 202 size, the wheel 212 mass, the handling rate and number of stations for the wheel 212. For example, as the handling rate for the rotary flipper 200 increases, the die 202 will be accelerated at higher rates and the holding force of the vacuum pressure should correspondingly increase. A vacuum sensor 412 may be used to detect proper pressure in the vacuum tube 224. In one embodiment, the vacuum 412 sensor may be implemented with an automatic shut off to stop operation of the rotary flipper 200 in the event of a pressure leak or other malfunction.

The vacuum pressure through the vacuum tube 224 is applied until the die 202 is released in the cavity 206. In one embodiment, control of the pressure to each of the stations is independently implemented. In one embodiment, vacuum pressure to the individual stations of the rotary flipper 200 is simplified using a vacuum stopper 240. The vacuum stopper 240 acts to permit vacuum pressure into the vacuum tube 224 based on the position of the vacuum tube 224. More specifically, the vacuum stopper 240 is situated such that vacuum pressure is applied through the vacuum tube 224 while the station 214 is approximately between the loading position 220 to the unloading position 226, and block the vacuum pressure to the vacuum tube 224 otherwise. In other words, once the station 214 leaves the loading position 220, the vacuum stopper 240 no longer restricts the vacuum pressure to the vacuum tube 224. When the station 214 reaches the unloading position 226, the vacuum stopper 240 blocks the vacuum pressure sufficiently such that the pressure on the die 202 is insufficient to hold it, and the die 202 is released into the cavity.

The vacuum pressure may be applied by any suitable device with enough pressure such that the die 202 does not move during transfer. In a preferred embodiment, a set of venturi valves may be used to establish vacuum within the vacuum tubes of the rotary flipper 200. Accordingly, a pressure of 60–100 psi is applied into the venturi valves to hold the die 202.

In another aspect, the rotary flipper 200 may also include an outer shield 242. The outer shield 242 is static contains the die 202 as it is transferred from the loading position 220 to the unloading position 226. In one embodiment, the outer shield 242 may be used as a safety in conjunction with the vacuum pressure applied through the vacuum tube 224. Alternatively, the outer shield 242 may be used the sole mechanism for maintaining the die 202 within the station 214 as it is transferred from the loading position 220 to the unloading position 226. In other words, when the station 214 reaches the unloading position 226, the outer shield 242 no longer contains the die 202 and the die 202 is released into the cavity 206. The outer shield 242 is preferably thin to minimize the distance between the wheel 212 and the cavity 206.

The rotary flipper 200 also includes a rotary actuator 244 for moving the wheel 212. By way of example, the rotary actuator 244 may be a stepper motor. Alternatively, the rotary flipper 200 may be any actuator capable of rotating the wheel 212, either directly or indirectly (i.e. through a gear system), with the required positional accuracy, force and speed.

The semiconductor device handling apparatus 300 may also include a number of sensors to facilitate semiconductor device handling. By way of example, a position sensor 246 may be used to detect the position of the rotary flipper 200. More specifically, the position sensor 246 may be an optical encoder used to detect, for example, the stopping positions of the rotary flipper 200. Alternatively, a release sensor 248 may be implemented to determine if the station 214 is in the proper unloading position 226 for releasing the die 202 into the cavity 206. By way of example, the release sensor 248 may be a light sensor which triggers when the edge of the station 218 reaches a predetermined point. Additionally, a camera 250 may also be used to determine if the die 202 was correctly released into the cavity 206.

Control the rotary flipper 200 may be flexibly administered. In one embodiment, a control box 252 is used. The control box 252 includes a number of components in electrical communication with the semiconductor device handling apparatus 300 through an electrical cable 253. The components include a processor 254, switches 256 and display panel 258. In another embodiment, a programmable logic controller (PLC) is used to detect solenoid control voltages and make decisions as to how the rotary flipper 200 operates. The PLC may be implemented with an existing semiconductor device handling apparatus 300 such that modifications are minimized. Control actions of the rotary flipper 200) may include resetting to home, indexing to the next cavity position, power on/off, ect. Indicators for one or more of these control actions, or other relevant control information, may be implemented on the display panel 258 to facilitate user interface. Control of the rotary flipper 200 may also be linked to the semiconductor device handling apparatus 300, i.e. the rotary flipper 200 may be turned on and initialized with startup of the semiconductor device handling apparatus 300.

Figure 5:
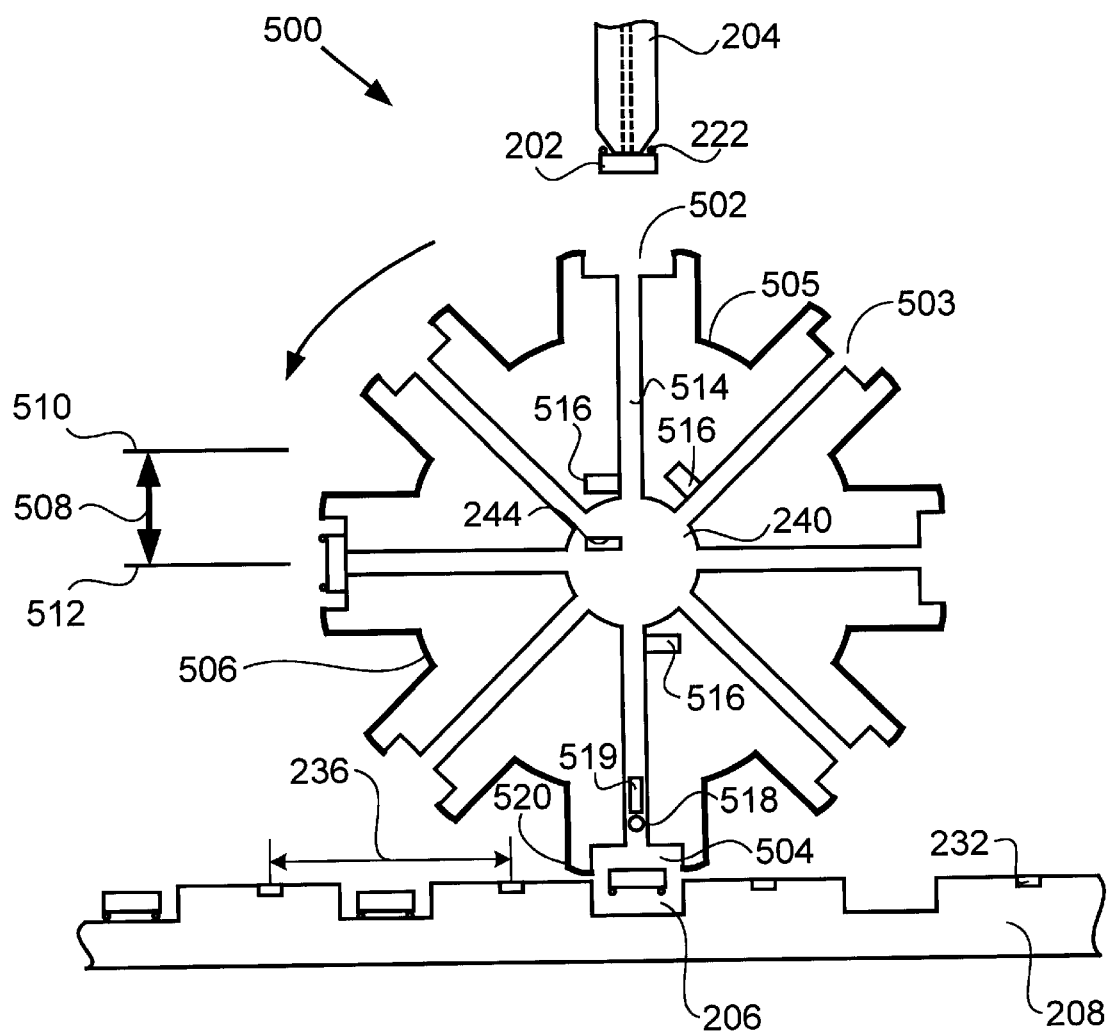
FIG. 5 illustrates a cross section of a rotary flipper in accordance with another embodiment of the present invention.

FIG. 5 illustrates a rotary flipper 500 in accordance with another embodiment of the present invention. The rotary flipper 500 is similar in operation to the rotary flipper 200 except for several design alternatives described below.

The rotary flipper 500 has a plurality of external stations 502, 503, 504 situated radially distant from the circumference 505 of a wheel 506. The wheel 506 is capable of vertical displacement. The vertical displacement may be used to move the station 504 closer to the cavity 206 before releasing the die 202. Correspondingly, the wheel 506 of the rotary flipper 500 is moved an offset distance 508. The offset distance 508 is the difference in the wheel 506 height between the rotating position 510 and an unloading position 512 in which the die 202 is released into the cavity 206.

The actuation used to alter the height of the rotary flipper 500 between the rotating position 510 and the unloading position 512 may be any such device capable of providing the required vertical displacement and speed. In one embodiment, a pneumatic slide may be implemented with the rotary flipper 500. Alternatively, a motor and cam system may be implemented in which the cam circumference matches the pitch 236 of the tape 208 and has a vertical displacement corresponding to the offset distance 508.

The rotary flipper 500 also includes independent control of the vacuum pressure applied to each of the stations 502, 503 and 504. The independent vacuum pressure is achieved through the independent control of the pressure within each of the vacuum tubes 514. By way of example, solenoid valves 516 may be used to turn on(off the pressure to the vacuum tubes 514. In this manner, vacuum pressure may be applied until the die 202 is in the position over the cavity 206, i.e. the wheel 506 is rotated and lowered in the proper position.

In another embodiment, the unloading position 512 will have a separate port 518 to facilitate unloading of the die 202. Upon reaching the unloading position 520, a switch $19 (a position sensor or other suitable control) will signal the port 518 to provide pressure to affect the transfer of the die 202 to the cavity 206. In other words, the die 202 is blown out of the station 502. In one embodiment, the blowoff pressure may be in the range of 5 to 10 psi and is applied for 1–5 milliseconds. In another embodiment, a pressure/vacuum solenoid valve is used to control the blowoff pressure. By way of example, an existing solenoid used in used in conventional two-station flippers may be used to minimize hardware adaptations and timing issues for controlling existing semiconductor device handling apparatus designs.

Having briefly discussed some design details for the rotary flipper 200 and the rotary flipper 500, some general application details will now be discussed.

Typically, the rotary flipper 200 will operate at the rate governed by the semiconductor device handling apparatus 300. In a preferred embodiment, the handling rate and motion of the rotary flipper 200 will automatically coordinate with the semiconductor device handling apparatus 300. Conventional semiconductor device handling apparatus operate a handling rate of 5–6 thousand units per hour and the rotary flipper is capable of operating at this handling rate. However, it should be borne in mind that the rotary flipper 200 is not limited to this handling rate. Indeed, the rotary flipper is capable of die handling at rates well in excess of five thousand units per hour, and as the handling rates of semiconductor device handling apparatus are improved, the handling rate of the rotary flipper 200 may be increased accordingly. In many cases, the rotary flipper 200 may not run at the fastest possible handling rate and is limited by the handling rate of a component of the semiconductor device handling apparatus 300.

In some cases, the rotary flipper 200 may coordinate with a particular component of the semiconductor device handling apparatus 300. By way of example, the rotary flipper 200 may automatically coordinate with the loader arm 204. More specifically, the rotary flipper 200 may be mechanically coupled with the loader arm 204. In one embodiment, gear coupling may be used to automatically coordinate motion between the loader arm 204 and the wheel 212. Obviously, the number of gears and gearing ratios may be altered based on the loader arm 204 as well as the wheel diameter 238 and number of stations 214 of the rotary flipper 200. Alternatively, the handling rate of rotary flipper 200 may be regulated by the feed of the tape and reel 210.

The rotary flipper 200 may be implemented within any semiconductor device handling apparatus; For example, a conventional semiconductor device handling apparatus, such as the Ismeca MP600. as manufactured by Ismeca Inc. of San Diego, Calif. is suitable for use with the present invention. In this case, a wheel diameter 238 of about between four and six inches is suitable and 8 to 64 stations 214 is suitable.

In one embodiment, the rotary flipper 200 is designed to minimize modifications to the semiconductor device handling apparatus it is implemented with. By way of example, in the conventional semiconductor device handling apparatus 100 equipped for the existing two station flipper 122, the existing hardware and software are preferably used with the rotary flipper 200. By way of example, the existing machine outputs are used with the rotary flipper 200. The components of the rotary flipper 200 may any suitable material as known in the art. By way of example, the wheel 212, outer shield 242 and vacuum stopper 240 may constructed of steel and may include Teflon linings to aid in the sealing of vacuum pressured areas.

Although only a few embodiments of the present invention have been described in detail, it should be understood that the present invention may be embodied in many other specific forms without departing from the spirit or scope of the invention. Particularly, although the invention has been described primarily in the context of vacuum pressure for holding the die in the station, other mechanisms for holding the die 202 are also within the scope of the present invention. By way of example, a clamping mechanism may be used to hold the die 202. In addition, although the discussion has focused primarily on handling the dies 202, the present invention is applicable to handling any semiconductor device including, but not limited to packaged dies, lead frames, encapsulated dies, flip chips, packages flip chips, etc. In addition, although the invention has been described with 8 to 64 stations, this number may vary based on the size of the wheel 212. Therefore, the present examples are to be considered as illustrative and not restrictive, and the invention is not to be limited to the details given herein, but may be modified within the scope of the appended claims.

What is claimed is:

1. A handling apparatus for use in conjunction with a tape and reel for placing semiconductor devices in cavities of the tape, the handling apparatus comprising:

a wheel;

a plurality of stations at the perimeter of the wheel, each station of the plurality of stations configured to receive an associated semiconductor device, each station of the plurality of stations having a first position for receiving its associated semiconductor device in a first orientation with solder bumps on the semiconductor device facing generally upward and having a second position for releasing the die in a second orientation with the solder bumps facing generally downward into an associated tape cavity; and a mechanism capable of holding the semiconductor devices in the stations.

2. The apparatus of claim 1 wherein the circumferential distance on the wheel between adjacent stations is about the distance between adjacent cavities on the tape.

3. The apparatus of claim 1 wherein the first orientation and the second orientation differ by 180 degrees.

4. The apparatus of claim 1 further including an actuator for rotating the wheel.

5. The apparatus of claim 4 wherein the actuator is a stepper motor.

6. The apparatus of claim 1 wherein the device has a handling rate of least 500 devices per hour.

7. The apparatus of claim 6 wherein the device has a handling rate of at least 2000 dies per hour.

8. The apparatus of claim 7 wherein the device has a handling rate of at least 5000 dies per hour.

9. The apparatus of claim 1 wherein the wheel includes from 8 to 64 stations.

10. The apparatus of claim 1 wherein the plurality of stations are recessed from the circumference of the wheel.

11. The apparatus of claim 1 wherein the stations are radially distant from the circumference of the wheel.

12. The apparatus of claim 1 wherein the mechanism capable of holding the semiconductor devices includes vacuum pressure applied to the back side of the semiconductor device.

13. The apparatus of claim 12 wherein the vacuum pressure for each station of the plurality of stations is independently controlled.

14. The apparatus of claim 1 wherein the mechanism capable of holding the semiconductor devices includes a shield external to the perimeter of the wheel.

15. The apparatus of claim 1 further including an unloading device which facilitates unloading of the semiconductor.

16. The apparatus of claim 15 wherein the unloading device is a blowoff port.

17. The apparatus of claim 1 wherein the wheel has a diameter between about 4 and 6 inches.

18. A semiconductor device handling apparatus for handling a semiconductor device in conjunction with a tape and reel, the apparatus comprising:

a vertically oriented rotary semiconductor device flipper having a plurality of stations located near the perimeter of the rotary semiconductor device flipper, each station of the plurality of stations configured to receive a first semiconductor device and each station of the plurality of stations having a first position for receiving the first semiconductor device in a first orientation, a second position for releasing the first semiconductor device to a cavity of the tape in a second orientation and a third position such that an adjacent station may receive a second semiconductor device in the first orientation before the first semiconductor device is released.

19. The apparatus of claim 18 further including a processor for controlling the semiconductor handling apparatus.

20. The apparatus of claim 18 further including a stepper motor for rotating the rotary semiconductor device flipper.

21. The apparatus of claim 18 further including a loader arm for transporting the semiconductor device.

22. A method for flipping semiconductor devices using a semiconductor device handling device, the semiconductor device handling device including a wheel and plurality of stations located near the circumference of the wheel, said method comprising:

receiving a first semiconductor device into a first station of the plurality of stations in a first orientation with solder bumps on the semiconductor device facing generally upward at a loading position;

moving the wheel such that the first station of the plurality of stations moves from the loading position to an intermittent position;

moving the wheel such that the first station of the plurality of stations moves from the intermittent position to an unloading position; and releasing the first semiconductor device from the first station in a second orientation with the solder bumps facing generally downward.

23. The method of claim 22 further including holding the semiconductor device in the first station.

24. The method of claim 22 wherein moving the wheel from the intermittent position to the unloading position includes a rotation of the wheel.

25. The method of claim 24 wherein the rotation is 180 degrees.

26. The method of claim 22 wherein moving the wheel from the intermittent position to the unloading position includes a vertical displacement of the wheel.

27. The method of claim 22 wherein the intermittent position includes receiving a second semiconductor device into a second station of the plurality of stations at the loading position.

28. The method of claim 22 wherein the unloading position is substantially close to a cavity of the tape.

* * * * *